(12) United States Patent
Bustos et al.

(10) Patent No.: US 7,494,932 B2
(45) Date of Patent: Feb. 24, 2009

(54) METHOD FOR THE FORMATION OF AN INTEGRATED ELECTRONIC CIRCUIT HAVING A CLOSED CAVITY

(75) Inventors: Jessy Bustos, Le Touvet (FR); Philippe Thony, Saint Joseph de Riviére (FR); Philippe Coronel, Barraux (FR)

(73) Assignees: STMicroelectronics (Crolles 2) SAS, Crolles (FR); Commissariat a l'Energie Atomique, Paris (FR)

( * ) Notice: Subject to any disclaimer, the term of this patent is extended or adjusted under 35 U.S.C. 154(b) by 274 days.

(21) Appl. No.: 11/441,814

(22) Filed: May 26, 2006

(65) Prior Publication Data

US 2006/0286491 A1 Dec. 21, 2006

(30) Foreign Application Priority Data

Jun. 9, 2005 (FR) .................................. 05 05883

(51) Int. Cl.
*H01L 21/311* (2006.01)
(52) U.S. Cl. ........................................ 438/700; 438/725
(58) Field of Classification Search .................. 438/700, 438/702, 706, 710, 712, 723, 724, 725; 216/58, 216/67
See application file for complete search history.

(56) References Cited

U.S. PATENT DOCUMENTS 5,981,150 A 11/1999 Aoki et al.
6,756,286 B1 * 6/2004 Moriceau et al. ............ 438/459
2003/0042627 A1 3/2003 Farrar et al.
2004/0104448 A1 6/2004 Marty et al.
2005/0176222 A1 * 8/2005 Ogura ........................ 438/514
2005/0208696 A1 * 9/2005 Villa et al. .................... 438/53
2005/0287767 A1 * 12/2005 Dantz et al. ................. 438/459

OTHER PUBLICATIONS

Sato, et al., "A New Substrate Engineering for the Formation of Empty Space in Silicon (ESS) Induced by Silicon Surface Migration;" Electron Devices Meeting, 1999; Piscataway, NJ, USA, IEEE, US, Dec. 5, 1999, pp. 517-520; XP010372210; ISBN: 0-7803-5410-9.
Sato, et al., "SON (Silicon on Nothing) MOSFET using ESS (Empty Space in Silicon) Technique for SoC Applications;" International Electron Deivces Meeting 2001; IEDM; Technical Digest, Washington, DC, Dec. 2-5, 2001, New York, NY; IEEE, US Dec. 2, 2001, pp. 37.1.1-37.1.4; XP010575245; ISBN 0-7803-7050-3.
Preliminary French Report, FR 0505883, dated Feb. 15, 2006.

* cited by examiner

*Primary Examiner*—Kin-Chan Chen
(74) *Attorney, Agent, or Firm*—Gardere Wynne Sewell LLP

(57) ABSTRACT

An integrated electronic circuit includes a cavity buried in a substrate. A surface of the substrate has a depression aligned above the buried cavity. The depression is filled with a material selected so that reflection of a lithography radiation on the substrate surface is attenuated. A resist layer is deposited on the circuit and then exposed to the radiation so that those resist portions which are located above the depression and those located away from the depression receive amounts of radiation that are below and above, respectively, the development threshold of the resist. An etching mask is therefore obtained on the circuit, which is aligned with respect to the cavity and its associated surface depression.

14 Claims, 3 Drawing Sheets

METHOD FOR THE FORMATION OF AN INTEGRATED ELECTRONIC CIRCUIT HAVING A CLOSED CAVITY

PRIORITY CLAIM

The present application claims priority from French Patent Application No. 05 05883 filed Jun. 9, 2005, the disclosure of which is hereby incorporated by reference.

BACKGROUND OF THE INVENTION

1. Technical Field of the Invention

The present invention relates to the formation of a mask on an integrated electronic circuit. It also relates to an integrated electronic circuit that includes a portion of a material forming a mark for reflecting radiation of the lithography process.

2. Description of Related Art

Various methods are known for forming a closed cavity in an integrated electronic circuit substrate. In accordance with one such method, an open cavity is firstly formed by etching into the substrate, starting from a surface thereof. The substrate is then heated so as to cause the cavity to close by deformation of the substrate. During this heating, part of the material of the substrate close to the surface of the latter moves around the opening of the cavity in such a way that this opening is progressively reduced in size and then closed off. The cavity is then closed and located depthwise in the substrate. For this reason, it is called a buried cavity. After the heating, the surface of the substrate is reconstructed at the location of the opening of the cavity. This surface is again substantially planar over an entire region of the circuit containing the cavity.

When the fabrication of the circuit is continued on the substrate provided with the buried cavity, it is difficult to produce circuit elements at positions on the surface of the substrate that are defined with respect to the buried cavity. It is possible to use alignment marks printed on the substrate, but it is therefore necessary for the circuit fabrication tools to be precisely aligned with these marks. Such an alignment operation is particularly lengthy, in particular when it is carried out by successive iterations with an offset measurement being made at each iteration.

There is accordingly a need in art to allow circuit elements to be produced easily on an integrated electronic circuit substrate at defined locations relative to a cavity buried in the substrate.

SUMMARY OF THE INVENTION

An embodiment of the invention proposes a method for forming a mask on an integrated electronic circuit, comprising the following steps:

a) forming at least one open cavity in a substrate of the circuit, said substrate being reflective for radiation of a lithography process and the cavity opening onto a substantially plane surface of the substrate;

b) heating the substrate so as to close off the cavity by deformation of the substrate, creating a depression in the surface of the substrate in line with the closed cavity, along a direction perpendicular to the substrate surface;

c) at least partly filling, the depression in the substrate surface with a portion of a material selected so that this portion attenuates a radiation reflected by the substrate;

d) forming a lithography resist layer on the circuit on top of the substrate surface;

e) exposing the resist layer to a primary radiation flux that corresponds to an amount of radiation below the development threshold of the resist and determined so that an amount of radiation corresponding to the sum of said primary flux and a secondary flux obtained by reflection of said primary flux on the substrate outside said portion is above the development threshold of the resist; and f) developing the resist layer so as to obtain a mask having an edge that corresponds to the outline of the depression in the substrate surface.

Thus, according to an embodiment of the invention, the substrate is heated so that the cavity closes, while leaving a deformation of the surface of the substrate at the location where the opening of the cavity was initially located. This deformation has the form of a depression in the surface of the substrate, which lies above the cavity. The cavity has therefore become buried in the substrate. The depression in the substrate surface is filled with a material that provides a contrast in reflection for radiation used in the lithography process. The resist layer is formed on the circuit, in a region of the latter that contains the portion of material filling the depression. The parameters governing the exposure of the resist to the radiation are selected so that resist portions not located above the depression are exposed to an amount of radiation that is above the development threshold of the resist, since these portions are exposed both to the primary radiation flux produced by a radiation source external to the circuit and to a secondary flux produced by reflection of the primary flux on the substrate. Resist portions located above the depression are mainly exposed to an amount of radiation that corresponds only to the primary flux, since the portion of filling material attenuates, or even eliminates, the secondary flux. Depending on the lithography resist used, i.e. positive or negative, some resist will remain on the circuit after development only in a region of the circuit that is located above the depression, or in a region of the circuit complementary to the depression. The portion of material that fills the depression in the surface of the substrate therefore serves as a mark for reflecting lithographic radiation so as to obtain a resist mask aligned with the buried cavity.

A first advantage of the method for forming a mask according to the invention lies in the, simplicity and rapidity of carrying out this method. This is because no step of aligning tools with the substrate is necessary, since the resist mask obtained is automatically aligned with the buried cavity.

A second advantage of the method for forming a mask according to the invention lies in its compatibility with buried cavities of any dimensions. This is because a buried cavity having large dimensions parallel to the substrate surface may be obtained from several open cavities formed at step a) near one another. The heating of step b) then causes these open cavities to join up into a single closed cavity of large dimensions, and the depression in the substrate surface that is simultaneously obtained corresponds to the extent of the entire closed cavity parallel to the surface of the substrate.

Advantageously, a layer of solid material may be deposited on the circuit between steps c) and d), and the method may further include the following step, carried out after step f), of g) etching the layer of solid material in accordance with the mask.

A portion of the solid layer therefore remains on the circuit, which is located above the buried cavity when the resist is of the negative lithographic resist type, or which covers the circuit outside a region corresponding to the buried cavity if the resist is of the positive type.

Optionally, the closed cavity may be at least partly filled with an electrically conductive material. It can then form an electrical connection segment located within the substrate. The closed cavity may also be at least partly filled with a material capable of extracting heat generated during operation of the circuit. It then forms a segment of a path for cooling the circuit.

The invention also relates to an integrated electronic circuit comprising:

a substrate having a substantially planar surface outside a depression in the latter;

a closed cavity located buried within the substrate aligned with the depression in the surface of the substrate along a direction perpendicular to this surface; and a portion of a material suitable for attenuating a lithographic radiation reflected on the substrate surface, the portion being arranged within the depression in the surface of the substrate.

Optionally, the circuit may further include part of a transistor located above the cavity along the direction perpendicular to the surface of the substrate.

In accordance with an embodiment of the invention, a method comprises forming a cavity in a substrate, heating the substrate so as to close off the cavity by substrate deformation thus leaving a depression in a surface of the substrate aligned with the closed cavity, and filling the depression with a lithographic radiation attenuating material.

In accordance with another embodiment, a method comprises forming a cavity in a substrate having a radiation reflective top surface, heating the substrate so as to close off the cavity by substrate deformation thus leaving a top surface depression aligned with the closed cavity, filling the top surface depression with a radiation attenuating material, forming a lithography resist layer above a location of the filled top surface depression, exposing the lithography resist layer to a radiation flux level below a development threshold of the lithography resist layer but high enough that a sum of the radiation flux level and a reflected radiation flux level is above the development threshold of the lithography resist layer, and developing the lithography resist layer so as to obtain a mask corresponding to the filled top surface depression.

In accordance with another embodiment, an integrated electronic circuit comprises a substrate including a buried closed cavity and having a top surface including a surface depression aligned with the location of the buried closed cavity. A first material fills the surface depression. A lower transistor gate material lies above the first material to define a lower gate region. A transistor source/channel/drain material is formed above the lower transistor gate material to define a channel region over the lower gate region. An upper transistor gate material lies above the transistor source/channel/drain material to define a an upper gate region over the channel region.

BRIEF DESCRIPTION OF THE DRAWINGS

Other characteristics and advantages of the invention will become further apparent on reading the description which follows. The latter is purely illustrative and should be read in conjunction with the appended drawings, in which.

DETAILED DESCRIPTION OF THE DRAWINGS

For the sake of clarity, the circuit elements shown in these figures have not been drawn to scale. N denotes a direction perpendicular to the surface of a substantially planar substrate used to produce the circuit. The direction N is directed upwards in the figures and the words "on", "under", "below" and "above" used below refer to this orientation. Furthermore, identical references in different figures denote identical elements or elements that have identical functions.

The description below will be limited to a succession of elementary steps for producing the integrated electronic circuit, allowing the invention to be reproduced. Each elementary step, which is considered as being well known, will not be discussed in detail.

Figure 1A:
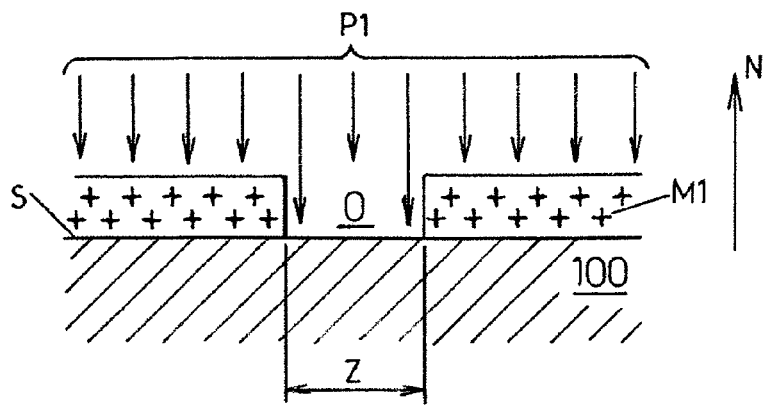
FIGS. 1a-1g are sectional views of an integrated electronic circuit illustrating successive steps of a method according to the invention.
Figure 1B:
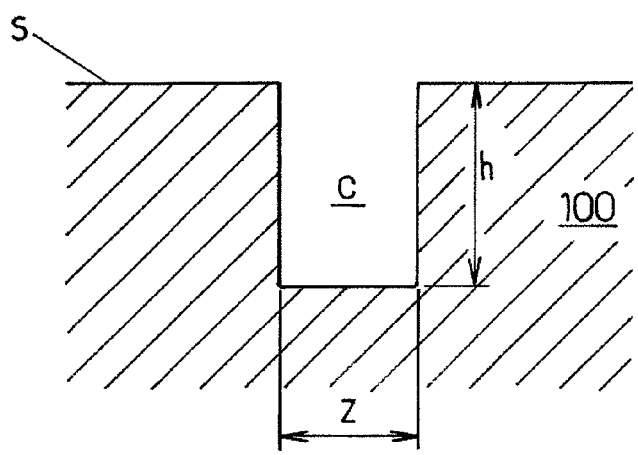

In FIG. 1a, a substrate 100 of an integrated electronic circuit in the course of being fabricated is covered on its upper surface S with a lithography resist mask M1. The substrate 100 may for example be made of single-crystal silicon. The mask M1 has an aperture O located above a specified region Z of the substrate 100. The substrate is then etched using a plasma P1. Ions of the plasma P1 are accelerated and directed against the upper surface of the circuit, parallel to the direction N but in the opposite sense thereto. Such an etching method is usually called dry anisotropic etching. A cavity C is thus progressively cut out into the substrate 100 starting from the surface S, in line with the aperture O in the mask M1 (FIG. 1b). The cavity C is open at the surface S and has a depth h defined by the duration of the etching step carried out on the substrate 100. The mask M1 is then removed, for example by dissolving it in a suitable solution.

Figure 1C:
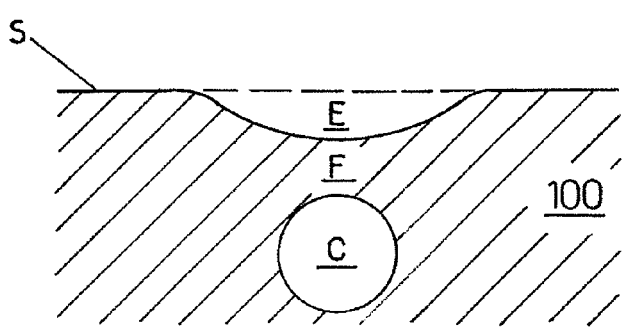

The circuit is then heated so as to cause the surface S of the substrate 100 to deform around the cavity C. For example, the circuit is heated to around 1100° C. in hydrogen for a few minutes. The material of the substrate 100 is then subjected to capillary forces around the cavity C, which cause certain portions thereof to move so as to reduce surface stresses present on the walls of the cavity C, especially at the corners of the cavity C. The opening of the cavity C on the surface S becomes progressively narrower, until it is completely closed off by a film F of material of the substrate 100 (FIG. 1c). The cavity C is then closed and located at a certain depth beneath the surface S. For this reason, it is called a buried cavity and has a rounded shape. At the same time, a depression E in the surface S of the substrate 100 appears above the cavity C.

The deformation of the cavity C showing the heating depends in a known manner on the variation in temperature undergone by the latter. For example, if the initial depth h of the cavity C is large and if the heating temperature is high, several cavities may appear, which are superposed along the direction N. A depression in the surface S is still present above the cavities.

It is also possible to produce a buried cavity of any shape and any extent parallel to the surface S of the substrate 100. To this end, the mask M1 has several separate apertures, but these are located near one another. The etching of the substrate then creates several separate open cavities, and the heating causes the material of the walls present between two adjacent cavities to contract. The cavities thus fuse together and this results in a single buried cavity of large dimensions. When the apertures of the mask M1 are aligned on the surface S, the buried cavity has the form of a tunnel. The dimensions of such a tunnel may for example be 10 μm (microns) in length, parallel to the surface S, and 50 μm in height, parallel to the direction N. A depression in the surface of the substrate is present above the tunnel, and its extent parallel to the surface S corresponds to the dimensions of the tunnel.

Figure 1D:
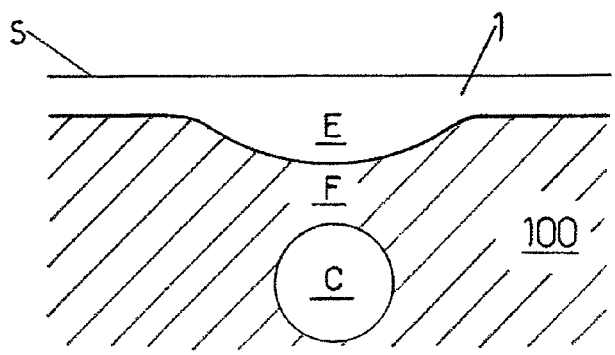

A layer 1 is deposited on the substrate 100 so as to fill the depression E (FIG. 1d). The material of the layer 1 is selected so as to attenuate, or eliminate, any reflection of radiation on the surface S of the substrate 100. This function of the layer 1 will be described in detail later.

Figure 1E:
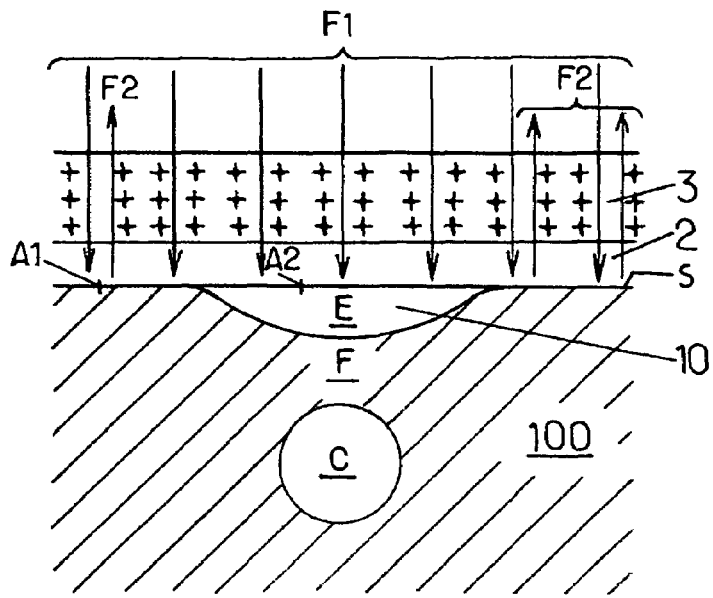

The circuit is then polished on its upper surface, so as to remove the layer 1 outside the depression E (FIG. 1e). After the polishing operation, the circuit has a planar upper surface, and a residual portion of the layer 1, with the reference 10, remains only in the depression E, that is to say in a region of the circuit lying above the cavity C.

A layer 2 is deposited on the circuit, this layer covering the portion 10 above the depression E and the substrate 100 outside the depression E. The material of the layer 2 may be electrically insulating or conductive, depending on the circuit element intended to be produced above the cavity C. For example, the layer 2 may be made of polysilicon, especially in order to produce part of an MOS (metal oxide semiconductor) transistor. Optionally, the layer 2 may comprise several elementary layers of different materials. The material(s) of the layer 2 and the thickness of the latter are furthermore selected so that the layer 2 is essentially transparent to the radiation used, the portion 10 thereof being intended to attenuate reflection on the substrate 100. The thickness of the layer 2 may for example be about 120 nm (nanometers).

The layer 2 is in turn covered with a continuous lithography resist layer 3. The layer 3 has a thickness suitable for forming an etching mask in the continuation of the method.

Next, the resist layer 3 is irradiated by directing a lithography radiation flux F1 (FIG. 1e) against the upper surface of the circuit, parallel to the direction N but in the opposite sense thereto. The flux F1 is called the primary radiation flux. The radiation used may be an electron beam having a suitable kinetic energy depending on the resist of the layer 3. The flux F1 passes through the layer 3 and the layer 2, since these layers are essentially transparent.

In a region of the circuit not containing the depression E, the primary flux F1 passes through the layers 3 and 2 and then reaches the surface S of the substrate 100. At a point A1 on the surface S located away from the depression E, the primary flux F1 is reflected by the substrate 100 back towards the upper surface of the circuit in the form of a secondary radiation flux F2. The secondary flux F2 then passes again through the resist layer 3.

Given the choice of material of the layer 1, no secondary flux is reflected towards the upper surface of the circuit at a point A2 lying in the depression E, since the portion 10 attenuates, or even eliminates, reflection of the radiation flux F1 on the substrate 100. For this reason, the layer 1 is called a BARC (bottom antireflection coating). To do this, the material of the layer 1 may be absorbent with respect to the radiation used. Alternatively, the material of the layer 1 may have suitable refraction properties so that the portion 10 provides an antireflection coating function with respect to the radiation used. For example, the layer 1 may be based on dense silica ($SiO_2$) or on a mixture of silica and another oxide chosen to increase the absorption and/or the refraction of the radiation.

Thus, portions of the resist layer 3 that are not located above the depression E are exposed to an amount of radiation that corresponds to the total flux F1+F2, whereas portions of the resist layer 3 that are located above the depression E are exposed to an amount of radiation that corresponds only to the primary flux F1. The intensity of the primary flux F1 and/or its duration are adjusted so that the amount of radiation that corresponds to the sum of the fluxes F1 and F2 is above the development threshold of the resist of the layer 3, and in such a way that the amount of radiation that corresponds only to the flux F1 is below the same threshold.

Figure 1F:
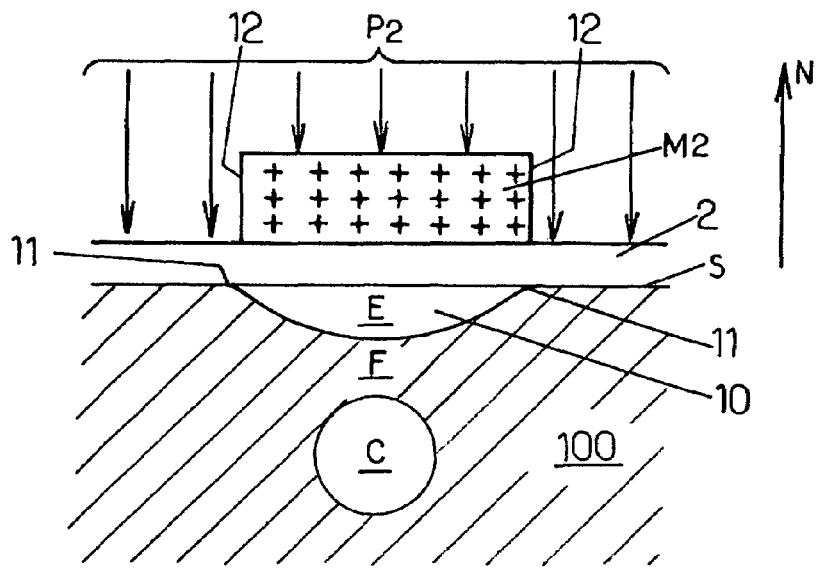

The resist layer 3 is developed in a known manner, for example using a dissolution bath. If the resist of the layer 3 is of the negative lithographic resist type, those portions of the layer 3 that were exposed to an amount of radiation corresponding to F1+F2 are removed, whereas those portions of the layer 3 which were exposed to an amount of radiation corresponding only to the primary flux F1 remain. After the development, a residual portion of the layer 3 is present only on the circuit above the depression E. This resist portion has dimensions, parallel to the surface S, which are approximately identical to those of the depression E. It forms a mask M2 that is located above the closed cavity C (FIG. 1f). This mask M2 has an edge 12 that corresponds to the outline 11 of the depression E in the surface S of the substrate 100.

Figure 1G:
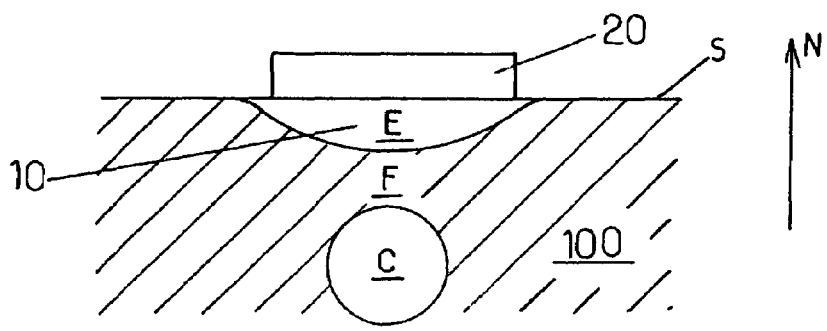

The layer 2 is then etched away in accordance with the mask M2 using an etching plasma P2 directed against the upper surface of the circuit, parallel to the direction N but in the opposite sense thereto. The extent of the etching, parallel to the surface S, is determined by the edge 12 of the mask M2. The layer 2 is thus removed on the outside of the depression E, until the upper surface of the substrate 100 is exposed (FIG. 1g). Part of the layer 2, with the reference 20, remains on the circuit above the depression E. The mask M2 is then completely removed.

Of course, the part 20 may be any element of the circuit that has to be located above the cavity C. In particular, the part 20 may comprise a channel and/or a gate structure of an MOS transistor.

Figure 2:
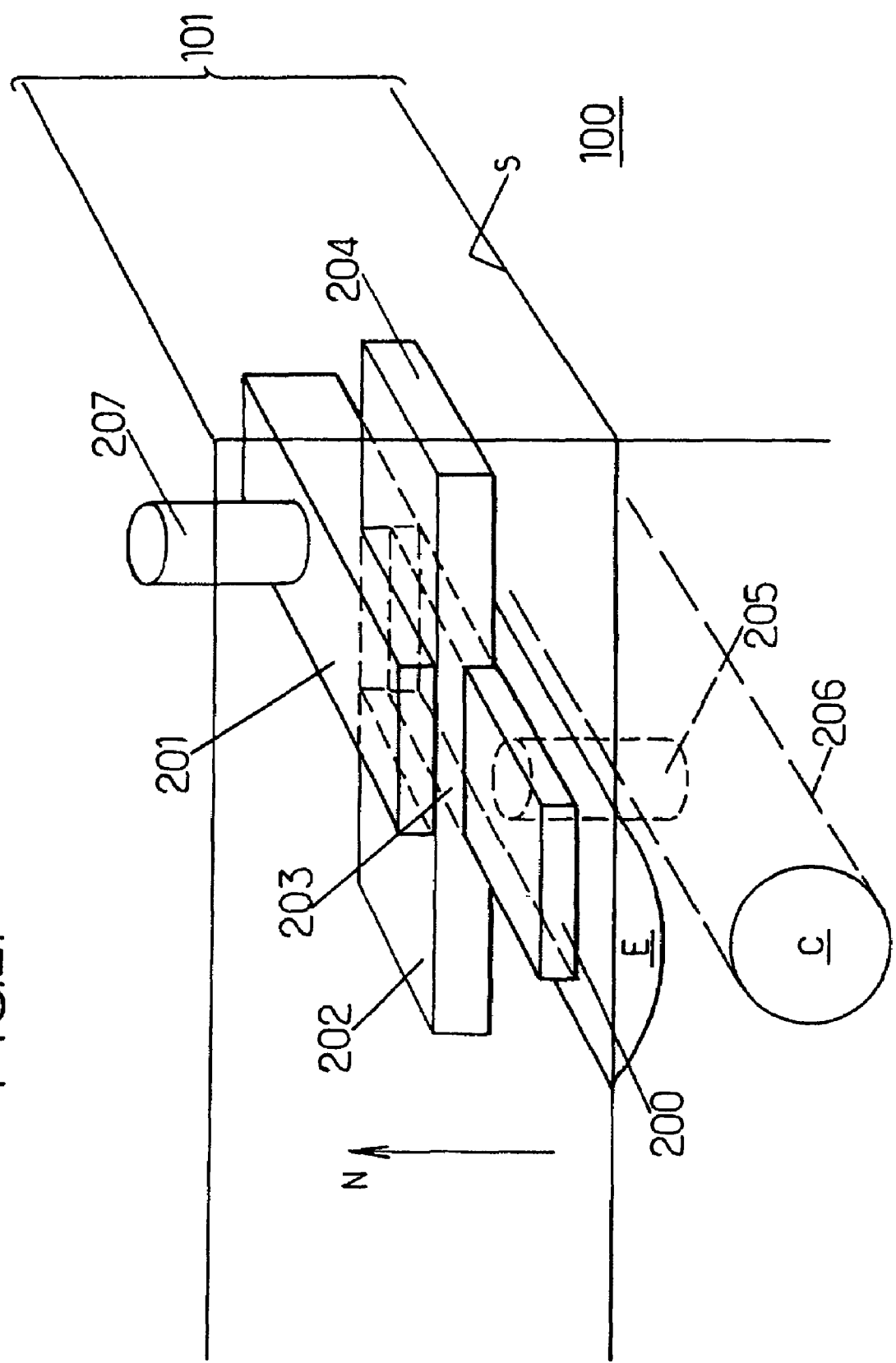
FIG. 2 illustrates an application of the invention to the production of a double-gate MOS transistor.

The buried cavity C may be at least partly filled with an electrically conductive material, for example to form an electrical connection. FIG. 2 illustrates such a buried electrical connection, which connects the lower gate part 200 of an MOS transistor. The references 201, 202, 203 and 204 denote an upper gate part, a source region, a channel region and a drain region, respectively, of the MOS transistor. The gate parts 200 and 201 and the regions 202-204 of the transistor are electrically isolated from one another by portions of intermediate insulating layers (not shown). The gate parts 200 and 201 lie below and above the channel region 203, respectively. The gate part 200 is electrically connected via a first connection 205 parallel to the direction N and via a second connection 206 produced by filling the cavity C with a conductive material. Optionally, the cavity C may be filled starting from the surface S via an access duct formed instead of the connection 205. Thanks to the buried location of the connection 206 in the substrate 100, the circuit has no footprint on the surface S. The design of the circuit is then easier. The gate part 201 may be electrically connected via a connection 207 placed for example across the premetallization level 101 of the circuit. Such a transistor therefore has two independent gate parts, to which different electrical potentials may be applied.

Alternatively, the cavity C may be at least partly filled with a material capable of extracting heat generated during operation of the circuit. A component of the circuit that generates heat is then advantageously produced above the cavity C, from the part 20. The material with which the cavity C is filled may be a heat-transfer fluid or a thermally conducting solid material.

Of course, many adaptations of the method described in detail above may be adopted, while still retaining at least some of the advantages of the invention. Among these adaptations, the following may be mentioned:

the lithography resist of the layer 3 may be of the positive type, so that resist portions exposed to an amount of radiation below the development threshold are selectively removed during development; and the layer 2 may be deposited on the circuit after the mask M2 has been formed and developed. In this case, those parts of the layer 2 that are deposited on the mask M2 are removed with the latter, whereas those parts of the layer 2 that are deposited on the circuit via apertures in the mask M2 remain definitively on the circuit.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A method for forming a mask on an integrated electronic circuit, comprising the following steps:
    a) forming at least one open cavity in a substrate of the circuit, said substrate being reflective for radiation of a lithography process and the cavity opening onto a substantially planar surface of the substrate;
    b) heating the substrate so as to close off the cavity by deformation of the substrate, creating a depression in the surface of the substrate aligned with the closed cavity, along a direction perpendicular to the substrate surface;
    c) at least partly filling the depression in the substrate surface with a portion of a material selected so that said portion attenuates a radiation reflected by the substrate;
    d) forming a lithography resist layer on the circuit on top of the substrate surface;
    e) exposing the lithography resist layer to a primary radiation flux that corresponds to an amount of radiation below the development threshold of the lithography resist layer and determined so that an amount of radiation corresponding to the sum of said primary flux and a secondary flux obtained by reflection of said primary flux on the substrate outside said portion is above the development threshold of the lithography resist layer; and
    f) developing the lithography resist layer so as to obtain a mask having an edge that corresponds to an outline of the depression in the substrate surface.

2. The method according to claim 1, wherein the resist is of the negative lithographic resist type so that a portion of the resist layer remains on the circuit above the depression in the substrate surface, along the direction perpendicular to the surface of the substrate.

3. The method according to claim 1, wherein a layer of solid material is deposited on the circuit between steps c) and d), the method further including the following step, carried out after step f): g) etching the solid material layer in accordance with the mask.

4. The method according to claim 1, wherein the radiation of the lithographic process comprises an electron beam.

5. The method according to claim 1, further comprising at least partly filling the closed cavity with an electrically conductive material in order to form an electrical connection segment arranged within the substrate.

6. The method according to claim 1, further comprising at least partly filling the closed cavity with a material capable of extracting heat generated during operation of the circuit.

7. A method, comprising:
    forming a cavity in a substrate;
    heating the substrate so as to close off the cavity by substrate deformation thus leaving a depression in a surface of the substrate aligned with the closed cavity; and
    filling the depression with a lithographic radiation attenuating material.

8. The method according to claim 7, further including forming a part of a transistor located above the filled depression.

9. The method according to claim 8 wherein forming a part of a transistor comprises:
    depositing a material layer above the filled depression;
    forming a lithography resist layer over the deposited material layer;
    exposing the lithography resist layer to a radiation flux level below a development threshold of the lithography resist layer but high enough that a sum of the radiation flux level and a reflected radiation flux level outside an area of the filled depression is above the development threshold of the lithography resist layer;
    developing the lithography resist layer so as to obtain a mask corresponding to the depression in the substrate surface; and
    etching the deposited material layer not covered by the mask to define the transistor part.

10. The method according to claim 7, further comprising at least partly filling the cavity with an electrically conductive material.

11. The method according to claim 7, further comprising at least partly filling the cavity with a material capable of extracting heat.

12. A method, comprising:
    forming a cavity in a substrate having a radiation reflective top surface;
    heating the substrate so as to close off the cavity by substrate deformation thus leaving a top surface depression aligned with the closed cavity;
    filling the top surface depression with a radiation attenuating material;
    forming a lithography resist layer above a location of the filled top surface depression;
    exposing the lithography resist layer to a radiation flux level below a development threshold of the lithography resist layer but high enough that a sum of the radiation flux level and a reflected radiation flux level is above the development threshold of the lithography resist layer; and
    developing the lithography resist layer so as to obtain a mask corresponding to the filled top surface depression.

13. The method according to claim 12, further comprising at least partly filling the cavity with an electrically conductive material.

14. The method according to claim 12, further comprising at least partly filling the cavity with a material capable of extracting heat.

* * * * *